United States Patent [19]

Terada et al.

[11] Patent Number: 4,569,119
[45] Date of Patent: Feb. 11, 1986

[54] MANUFACTURING METHOD OF SCHOTTKY GATE FET

[75] Inventors: Toshiyuki Terada, Kawasaki; Nobuyuki Toyoda, Yokohama; Akimichi Hojo, Yokohama; Kiyoho Kamei, Yokohama, all of Japan

[73] Assignee: Kabushiki Kaisha Toshiba, Kawasaki, Japan

[21] Appl. No.: 618,262

[22] Filed: Jun. 7, 1984

[30] Foreign Application Priority Data

Jun. 13, 1983 [JP] Japan ................................ 58-105306

[51] Int. Cl.$^4$ ..................... H01L 21/265; H01L 21/24
[52] U.S. Cl. ..................................... 29/571; 29/576 B; 29/578; 29/579; 148/1.5; 148/187; 357/91
[58] Field of Search ................... 148/1.5, 187; 29/571, 29/576 B, 578, 579; 357/91

[56] References Cited

U.S. PATENT DOCUMENTS

| | | | |
|---|---|---|---|
| 4,344,980 | 8/1982 | Yoder | 29/576 B |
| 4,351,099 | 9/1982 | Takagi | 29/571 |
| 4,403,396 | 9/1983 | Stein | 29/571 |
| 4,472,872 | 9/1984 | Toyoda et al. | 29/571 |
| 4,481,704 | 11/1984 | Darley et al. | 29/571 |

FOREIGN PATENT DOCUMENTS 57-196581 12/1982 Japan .
58-96769 6/1983 Japan .

OTHER PUBLICATIONS

Alcorn et al., IBM—TDB, 20 (1978) 4009.
Bergeron, IBM—TDB, 21 (1978) 1371.
Matsumoto et al., Jap. Jour. Appl. Phys. 21 (1982) L-445-446.

Primary Examiner—Upendra Roy
Attorney, Agent, or Firm—Oblon, Fisher, Spivak, McClelland & Maier

[57] ABSTRACT

An etched SiO$_2$ film component serving as a mask at the time of formation of source and drain electrodes in a surface layer of a GaAs substrate by means of ion implantation is side-etched before a gate electrode is formed. An SiO$_2$ film component has a narrowed width smaller than a distance between the source and drain electrodes while the SiO$_2$ film component supports a metal mask patterned film at its top surface. The SiO$_2$ film component is replaced with a metal layer serving as a gate of a self-aligned Schottky gate FET. According to this method, a metal with high heat resistance need not be used as a metal material of the gate layer.

14 Claims, 28 Drawing Figures

MANUFACTURING METHOD OF SCHOTTKY GATE FET

BACKGROUND OF THE INVENTION

The present invention relates in general to a method of manufacturing a semiconductor device and, more in particular, to a method of manufacturing Schottky gate type field effect transistors which comprise a compound semiconductor material such as GaAs.

Conventional Schottky gate field effect transistors or metal oxide semiconductor field effect transistors which comprise GaAs have been used as semiconductor devices in a variety of applications so as to constitute high-frequency amplifiers, oscillators and the like. The importance of these transistors as basic unit elements in integrated circuits (ICs) has been increasing recently.

Under these circumstances, various technical approaches have been made in an attempt to improve high-frequency characteristics of the GaAs MESFETs. In order to improve the high-frequency characteristics of the MESFETs, (1) a capacitance Cgs between the gate and the source must be decreased and/or (2) a transconductance gm of the FET must be increased. A parasitic capacitance must be decreased in order to decrease the capacitance Cgs. On the other hand, a distance between gate and source regions in a substrate must be shortened as much as possible in order to increase the transconductance gm. When the gate-source distance is decreased, a series resistance Rs in the source-gate path can be decreased, so that the transconductance gm can approach an intrinsic transconductance gmO determined in accordance with electrical characteristics of the FET channel region. It is also possible to increase the transconductance gmO itself by decreasing a length of a gate layer.

In order to improve the high-frequency characteristics of the MESFETs, a self alignment technique is adopted in accordance with the above principle. For example, a gate layer is used as a mask when ion implantation is performed to form the source and drain regions. The gate region can be properly aligned with the high impurity regions (i.e., source and drain regions) without overlapping these high impurity regions, thereby decreasing the parasitic capacitance of the MESFETs. However, according to the method described above, a metal which can withstand annealing at a high temperature (e.g., 800° C.) after ion implantation and which has a good Schottky barrier must be used as the gate material. The metal (e.g., W, Mo, Ta, Ti) has generally poor mechanical adhesion (bonding) with GaAs, thereby decreasing the yield of the MESFETs.

In order to solve the above problem, according to Japanese Patent Disclosure (Kokai) No. 58-96769 (Y. Sano et al), a technique is described wherein side portions of the insulating layer for supporting a metal layer as a mask for ion implantation are overetched. By controlling the amount of overetching, the gate-source distance can be decreased so as to decrease the series resistance component. However, overetching is performed prior to ion implantation for forming the source and drain regions in the substrate. As a result, the metal layer as the mask and the side-etched insulating layer are exposed to a high temperature during annealing. Therefore, a mask metal must comprise a metal having a high heat resistance.

According to Japanese Patent Disclosure (Kokai) No. 57-196581 (T. Konuma et al), in order to enhance the maximum oscillation frequency of the GaAs MESFET, a self alignment technique is disclosed to decrease the series resistance between the source and the gate. This self alignment technique provides FETs each having a gate electrode with a T-shaped section. A two-layer structure consisting of a side-etched silicon nitride film and a silicon oxide film is used in place of a metal as a mask layer for ion implantation. In this conventional method, the silicon nitride film is side-etched prior to ion implantation.

SUMMARY OF THE INVENTION

It is an object of the present invention to provide a new and improved method of manufacturing Schottky gate type FETs with enhanced high-frequency characteristics.

According to a method of manufacturing a Schottky gate FET or MESFET according to the present invention, an insulating layer is formed on a compound semiconductor substrate. This layer is etched to form an insulating layer component having a first width on the substrate. The substrate is subjected to ion implanation, so that first and second semiconductor regions corresponding to the source and drain of the transistor are formed in a surface layer of the substrate so as to self-align with the insulating layer component. The side portions of the insulating layer component are side-etched at a predetermined depth, so that the width of the insulating layer component becomes a second width smaller than a first width. After annealing the structure to form source and drain region which are electrically activated, an organic layer such as a photoresist layer is deposited on the substrate so as to expose the top surface of the layer component therethrough. Subsequently, the layer component is removed, so that the organic layer has an opening which has the same width as the second width of the insulating layer component. The substrate is partially exposed through the opening. A metal layer serving as the gate electrode of the MESFET and having the reduced second width is formed on an exposed surface portion of the substrate through the opening. The gate electrode thus formed has a width smaller than a length between the source and drain regions, thereby enhancing a decrease in capacitance between the gate and the source-drain path.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1A:
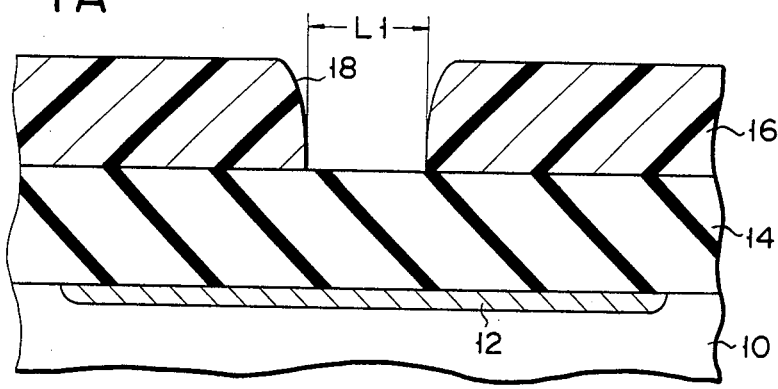
FIGS. 1A-1J illustrates, in schematic cross-section, some of the major steps in the formation of a GaAs MESFET in accordance with a manufacturing method of one embodiment of the present invention.
Figure 1B:
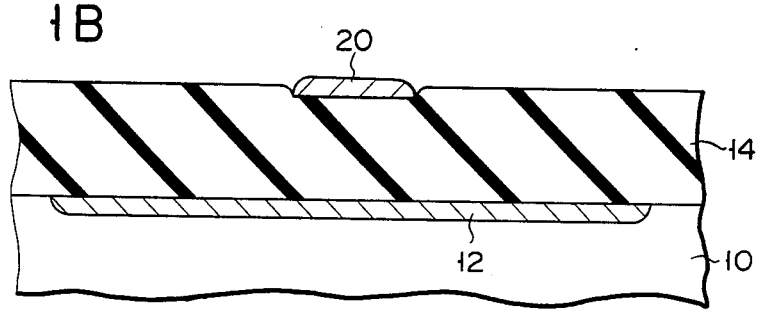

A semi-insulating gallium arsenide (GaAs) substrate 10 into which, for example, chrominum (Cr) is doped is shown in FIG. 1A. Silicon ions Si+ are implanted into the substrate 10 at accelation energy of 100 KeV and a dose of $3.0 \times 10^{12}$ ions/cm$^2$. Thereafter, the structure is properly annealed in an atmosphere of AsH$_3$ at a temperature of 850° C. for 15 minutes to form an electrically active layer 12 therein. An SiO$_2$ film 14 is deposited on the substrate 10 to have a thickness of about 1 $\mu$m, according to a well-known CVD method. A photoresist film 16 is formed on the SiO$_2$ film 14. An opening 18 is formed in the film 16 in a gate electrode formation region above the substrate 10 to have a width L1 of 1.0 $\mu$m, by the known photo-lithography technique.

Subsequently, an Al layer as a metal layer to be a mask for reactive ion etching (RIE) is deposited on the structure of FIG. 1A to a thickness of about 1,000 Å. Then, the Al layer is lifted off to obtain a patterned Al layer or an Al pattern 20 corresponding to the opening (resist pattern) 18 of the photoresist film 16. In this case, prior to the deposition of the Al layer, the SiO$_2$ film 14 is etched to a depth substantially the same as a thickness of the Al layer to be formed. Then, the Al layer portion in the opening 18 can be easily removed from the Al layer portion (not shown) on the photoresist film 16. Accordingly, the good lift-off process can be performed without forming a flash.

Figure 1C:
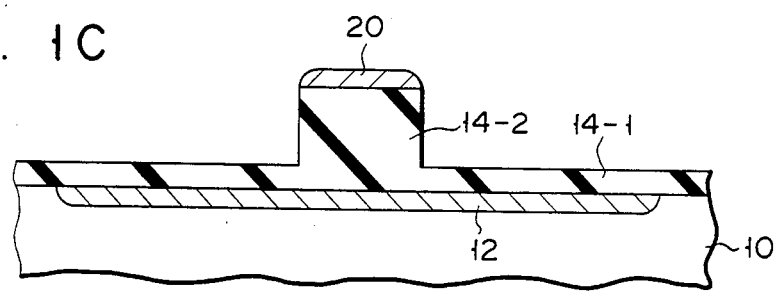

By using the Al pattern 20 as a mask, the SiO$_2$ film 14 is etched to a depth of about 8,000 Å by a parallelplate type RIE apparatus. As a result, an SiO$_2$ film 14-1 of a thickness of 2,000 Å is left at a structure portion other than the masked portion as shown in FIG. 1C. The RIE conditions are set as follows: gas mixture of CF$_4$ and H$_2$ is used as etching gas, flow rates of CF$_4$ and H$_2$ are 20 cc/min and 10 cc/min, respectively, a gas pressure in etching is 0.07 Torr, and an RF power is 200 W. Under these conditions, etching rates of SiO$_2$ film and Al layer are up to 500 Å/min and up to 20 Å/min, respectively, and therefore the etching ratio of Al to SiO$_2$ is as high as 20:1 or more. Therefore, an Al layer as thin as 1,000 Å can provide a satisfactory mask effect during RIE for etching the SiO$_2$ film by 1 $\mu$m.

After a photoresist pattern 22 having an opening 24 at a transistor element formation region is formed by a known lithography technique, the SiO$_2$ film 14-1 is etched by the RIE technique again. Then, the substrate 10 is exposed in the transistor element formation region. N-type impurity ions such as Si+ ions are implanted in the exposed surface layer of the substrate 10 at an accelation energy of 200 KeV and a dose of $3.0 \times 10^{13}$ ions/cm$^2$, thereby forming high-concentration impurity regions 25a and 25b corresponding to source and drain regions of a MESFET to be manufactured. In this case, ions cannot be implanted at the surface layer portion of the substrate 10 which is positioned immediately below an SiO$_2$ film component 14-2 covered by the Al pattern 20, since the SiO$_2$ film component 14-2 serves as a mask for ion implantation. Therefore, the active layer 12 is still left at the portion of the surface region of the substrate 10 below the SiO$_2$ film component 14-2.

Figure 1D:
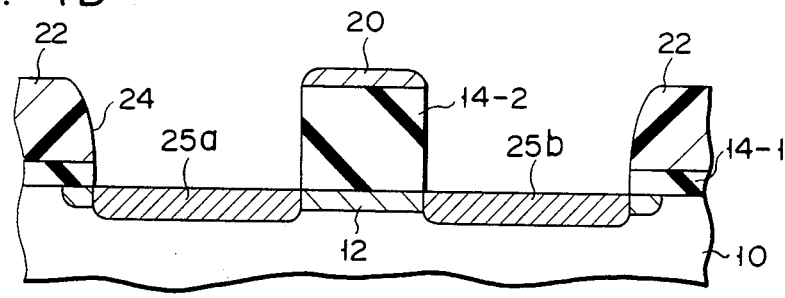
Figure 1E:
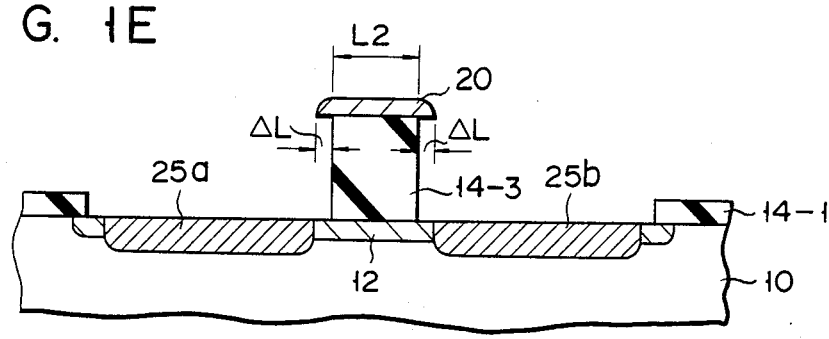

After the ion implantation has been completed, the patterned SiO$_2$ film component 14-2 (FIG. 1D) is isotropically etched by using the Al pattern 20 as a mask again according to a chemical dry etching (CDE) technique. An etching rate of the SiO$_2$ film component 14-2 in CDE is up to 200 Å/min, so the substrate 10 and the Al pattern 20 are not be etched. Therefore, when CDE is performed for 10 minutes, the SiO$_2$ film component 14-2 under the Al pattern 20 is side-etched by a width of $\Delta L = 0.2$ $\mu$m at each side surface thereof, as shown in FIG. 1E. In other words, the two side surfaces of the SiO$_2$ film component 14-2 under the Al pattern 20 are etched laterally, by a width of $\Delta L$, respectively. This side-etching can be performed with high precision. Then, a gate electrode region can be formed in a later step to have a width of L2 ($= 1.0 - (0.2 \times 2) = 0.6$ $\mu$m) such that its side surfaces are formed apart from corresponding edges of the high-concentration impurity regions 25a and 25b by a distance $\Delta L$ ($= 0.2$ $\mu$m), respectively. It is apparent from FIG. 1E that the side surfaces of the side-etched SiO$_2$ film component 14-3 as described above are spaced from the corresponding edges of the regions 25a and 25b by the distance $\Delta L$ ($= 0.2$ $\mu$m), respectively. In this CDE process, the peripheral thin SiO$_2$ film component 14-1 is also side-etched.

Figure 1F:
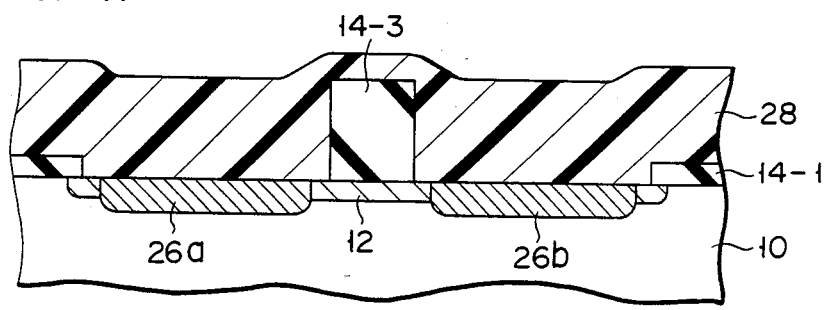

After the photoresist pattern 22 and the Al pattern 20 are removed by a known method, the structure of FIG. 1E with the SiO$_2$ film components 14-1 and 14-3 is annealed in an atmosphere of AsH$_3$ at a temperature of 800° C. for 15 minutes. Then electrically-activated regions 26a and 26b are obtained. The Al pattern 20 can be easily removed using NaOH, HCl or the like which does not damage the substrate 10. After annealing, a photoresist film 28 is deposited to make flatten the structure surface, as shown in FIG. 1F. In this case, the present inventors found that when a positive photoresist material having a viscosity of 27 cp was deposited on the structure rotating at a speed of 6,000 rpm for 30 seconds, the photoresist film 28 had a thickness of 1.1 $\mu$m on the flat portion of the structure and a thickness of 0.3 $\mu$m on the SiO$_2$ film component 14-3 of a thickness of 9,000 Å to 1 $\mu$m. Therefore, the surface of the photoresist film 28 was substantially flat. The multi-layered structure of this state is illustrated in FIG. 1F.

Figure 1G:
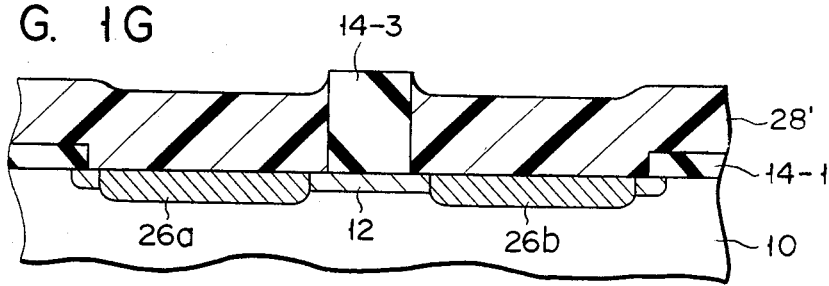
Figure 1H:
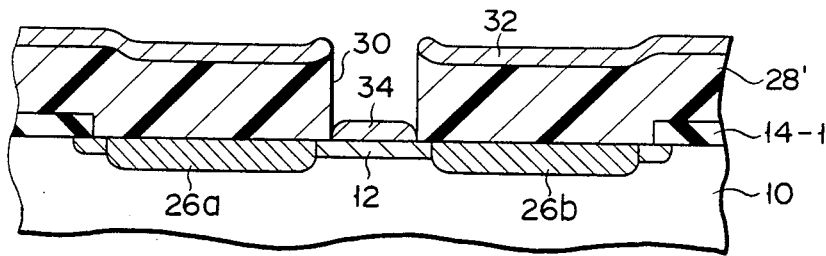

When the photoresist film 28 is etched from the entire structure surface, the top portion of the side-etched SiO$_2$ film component 14-3 in the gate electrode formation region is exposed, as shown in FIG. 1G. The RIE process using O$_2$ gas is most suitable for such removal of a portion protruding above the photoresist film 28. As RIE is substantially anisotropic dry etching, only a thickness of the film can be decreased and the pattern of the photoresist film can be maintained. For example, the etching rate of the photoresist is about 800 Å/min under the conditions in which a flow rate of O$_2$ gas is 10 SCCM, a gas pressure is 0.05 Torr and an RF power is 100 W. Then, RIE is not affected by an increase in temperature of the substrate 10. Therefore, RIE is preferable in terms of uniformity within a horizontal plane, reproducibility and controllability and the like as compared to those of removal of the photoresist using a solution. When RIE of the photoresist film 28 using O$_2$ gas was performed under these conditions for 7 minutes, the photoresist film of a thickness of about 5,500 Å was left at the flat portion of the substrate 10. However, the photoresist film formed on the SiO$_2$ film component 14-3 in the prospective gate electrode formation region was completely removed, because it had only a small thickness as described above.

After the photoresist film 28 is etched to expose the top surface of the SiO$_2$ film component 14-3 as described above, the SiO₂ film component 14-3 is removed. As a result, an etched photoresist film 28' has an opening 30 through which the substrate surface of the prospective gate region is exposed.

Figure 1I:
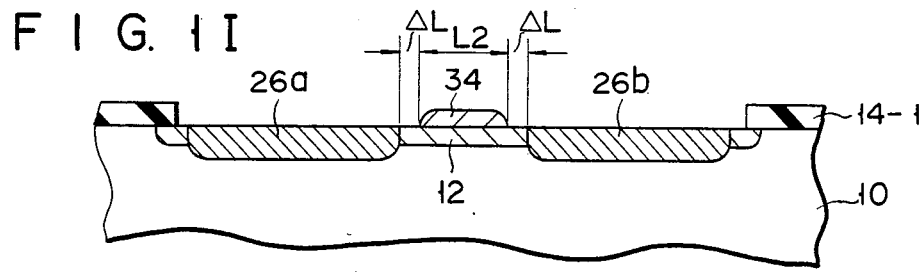

Subsequently, a metal material such as Pt for a gate electrode is deposited on the photoresist film 28' having the opening 30. In the deposition process, a Pt film 32 of a thickness of 1,000 Å is formed on the photoresist film 28' and a Pt film 34 of the same thickness as the Pt film 32 is formed on the surface portion of the substrate 10 exposed through the bottom surface of the opening 30. Such a separation of the Pt films 32 and 34 results from the fact that the etched edge poritons of the opening 30 formed in the photoresist film 28' are very steep. The photoresist film 28' on which the Pt film 32 is formed is removed from the substrate 10 according to a known lift-off technique. As a result, the structure of FIG. 1I can be obtained wherein the SiO₂ film 14-1 serving as a field insulation film and the Pt film 34 as a gate electrode remain on the substrate 10. The Pt film 34 has a precise width of L2 ($=0.6$ μm) as defined above, so that two end portions of the Pt film 34 are spaced from the corresponding edges of the source and drain regions 26a and 26b by the distance ΔL ($=0.2$ μm), respectively.

Figure 1J:
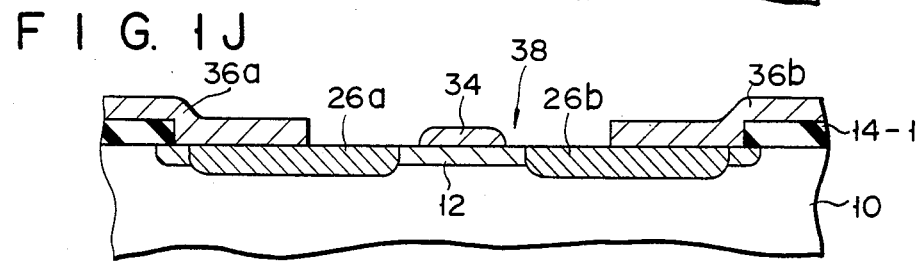

Thereafter, source and drain electrodes 36a and 36b were made of an Au—Ge based alloy, and a self-aligned MESFET 38 shown in FIG. 1J was formed. The electrical characteristics of the resultant MESFET 38 were measured. The gate length defined to be 1 μm at the time of masking was decreased to 0.6 μm in the resultant MESFET. Although the distance between the source and the gate or between the gate and the drain was 0.2 μm, the gate electrode did not overlap the high impurity regions (i.e., source and drain regions). As a result, the present inventors found that the source series resistance and the gate capacitance were sufficiently small, and that the drain breakdown voltage was very high.

According to the self-aligned GaAs MESFET manufactured by the method described above by adding the side-etching process of FIG. 1E, the gate electrode 34 can be formed on the substrate such that the width of the gate electrode 34 becomes smaller than the channel region width defined between the source and drain regions 26. Therefore, the parasitic capacitance between the gate and the source or between the gate and the drain can be minimized, thereby greatly improving the high-frequency characteristics of the MESFET.

Furthermore, according to this method of manufacturing a GaAs MESFET, a special metal which has high heat resistance but poor adhesion with GaAs need not be used as a metal material for the gate electrode 34, unlike in the conventional method. Therefore, any metal normally used for forming gate electrodes can be used to form a good Schottky barrier, and the electrical characteristics of the MESFET can be greatly improved. The reason why a metal of high heat resistance need not be used lies in the fact that a high temperature treatment such as annealing need not be performed after the gate electrode 34 is formed. According to the present invention, annealing of the source and drain regions 26 which exposes the gate electrode 34 to a high temperature has finished before the gate electrode 34 is formed. In other words, according to the method described above, after the source and drain regions 26 are formed, the insulating film pattern as the mask for ion implantation is transferred to the gate electrode. Therefore, annealing at a high temperature need not be performed after the gate electrode is formed. Therefore, any metal can be used to form the gate electrode so as to obtain a good Schottky barrier. After ion implantation is performed to form to the source and drain regions by using as a mask the insulating film patterned by anisotropic etching, the side surface portions of the insulating film are etched by isotropic etching, so that the remaining insulating pattern is transferred to the gate electrode. Therefore, the gate length becomes shorter than that of the mask. The gate does not overlap the source and drain regions and so constitutes a self-aligned structure. As a result, the gate-source capacitance Cgs becomes small, and a high-performance MESFET can be obtained.

Furthermore, according to the method described above, the organic layer 28 is formed to bury the side-etched SiO₂ film 14-3 therein in the process shown in FIG. 1F. In this manner, after the layer 28 is made flat, the upper surface portion of the layer 28 is removed to expose the top surface of the SiO₂ film 14-3. After the SiO₂ film 14-3 is removed, the organic layer 28' is used as a lift-off material, thereby forming the gate electrode 34. This process can be easily performed wherein the SiO₂ pattern 14-3 is transferred to the gate electrode 34.

Figure 2A:
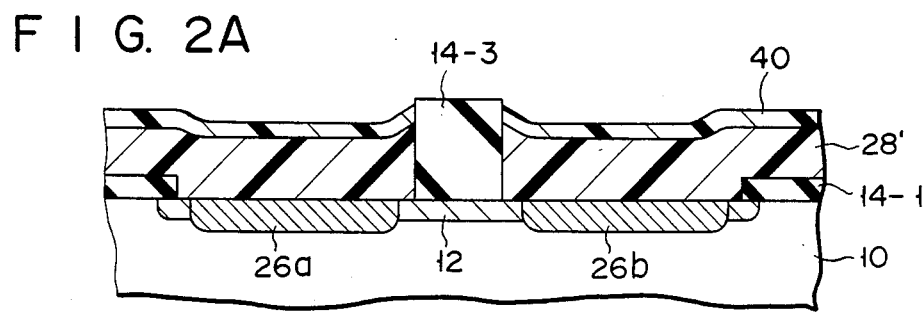
FIGS. 2A-2C illustrates, in schematic cross-section, some of the major steps in the formation of a GaAs MESFET, which is a modification of the embodiment shown in FIGS. 1A-1J.
Figure 2B:
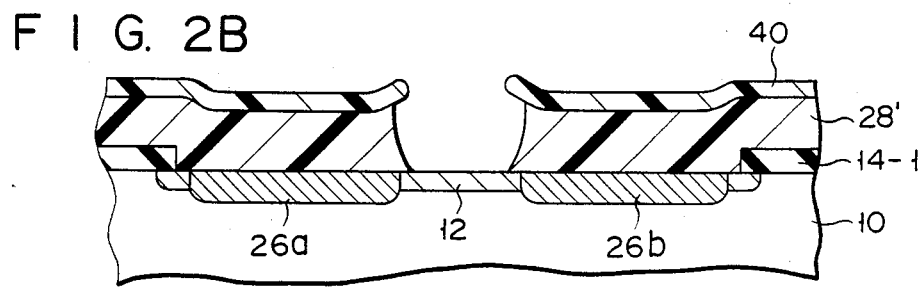
Figure 2C:
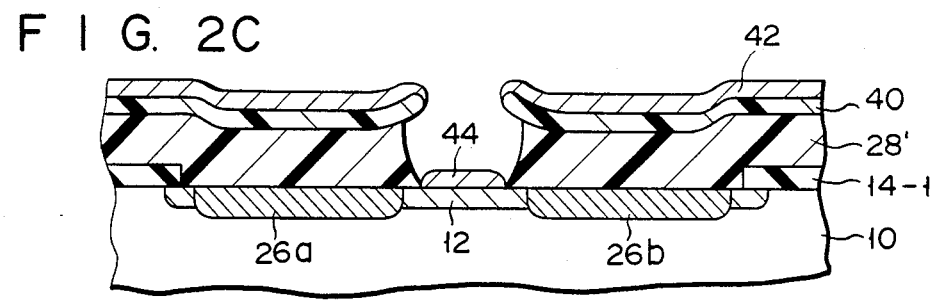

In the process (FIG. 1G) according to the first embodiment of the manufacturing method, after the top surface of the SiO₂ film 14-3 in the gate electrode region is exposed, the resultant structure is dipped in a solution of chlorobenzene. The photoresist film is then modified and hardened by chlorobenzene, so that a hardened film 40 as shown in FIG. 2A is formed. Thereafter, after the SiO₂ film 14-3 is removed, the resultant wafer structure is dipped in a developing solution. The film 40 hardened by chlorobenzene will not be developed, and the underlying photoresist film 28' is slightly etched, thereby obtaining an over-hang structure as shown in FIG. 2B. Thereafter, Pt films 42 and 44 as gate electrode metal layers may be deposited by sputtering which provides good step coverage. In this case, the Pt films 42 and 44 on the photoresist film within the pattern can be properly separated to provide the over-hang structure, thereby facilitating the lift-off process.

Figure 3A:
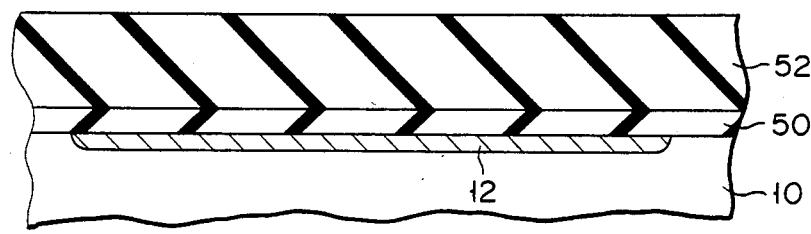
FIGS. 3A-3D illustrates, in schematic cross-section, some of the major steps in the formation of a GaAs MESFET of another modification of the above embodiment shown in FIGS. 1A-1J.
Figure 3B:
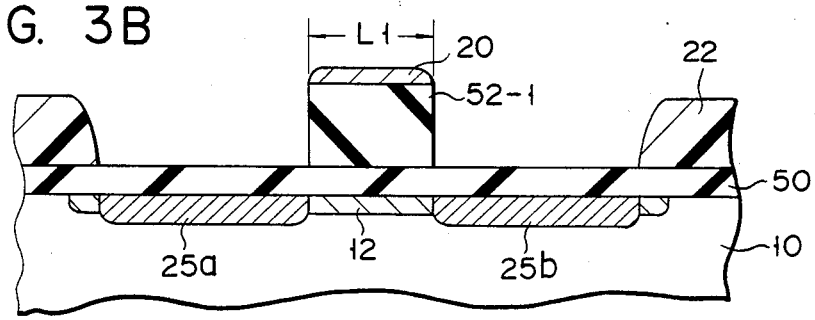

Another modification will be described with reference to FIGS. 3A to 3D. The SiO₂ film 14 in the embodiment described above is replaced with a two-layer structure consisting of an SiO₂ film 50 and an Si₃N₄ film 52, as shown in FIG. 3A. The SiO₂ film 50 has a thickness of 2,000 Å, and the SiN film 52 has a thickness of 8,000 Å. Windows for ion implantation of a high impurity are formed in the SiN film 52 to expose the SiO₂ film 50, as shown in FIG. 3B. Si+ ions are ion-implanted in the substrate 10 through the SiO₂ film 50 of 2,000 Å thickness at a dose of $3.0\times10^{13}$ ions/cm² and acceleration energy of 250 keV, thereby forming the source and drain regions 26a and 26b. In this case, the etching ratio of SiN to SiO₂ in RIE using CF₄ gas can be 2:1 or more. Therefore, it is easy to stop etching when the surface of the SiO₂ film is exposed.

Figure 3C:
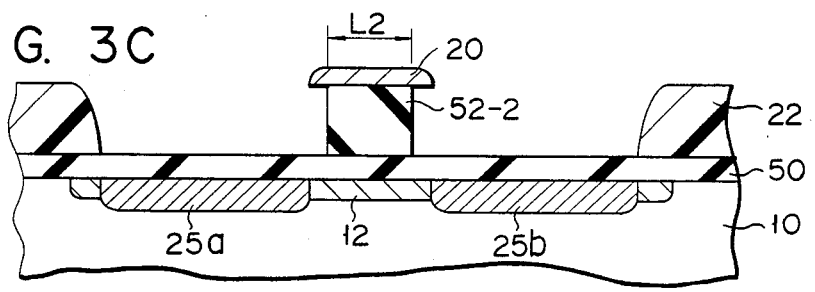
Figure 3D:
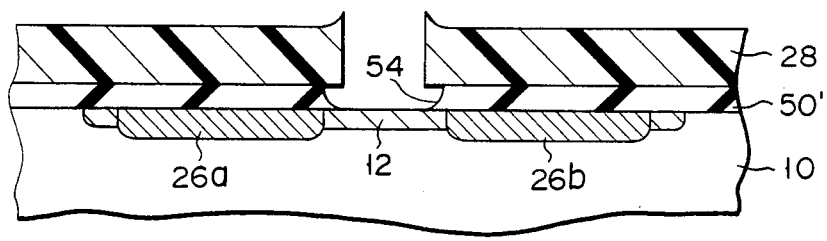

Thereafter, as shown in FIG. 3C, an SiN film component 52-1 is side-etched by CDE in the same manner as described above. In this case, the etching ratio of SiN to SiO₂ is as large as 10:1, so that the SiO₂ film 50 is not substantially etched. As a result, only the side wall portions of the SiN film 52-1 are etched. This structure can be annealed in a normal atmosphere of N₂, Ar or H₂ so as to activate the impurity in the high impurity layers covered with the SiO₂ film. In addition, the photoresist film 28 is formed in the same manner as the above-described embodiment so as to obtain a flat surface on the resultant structure. Thereafter, when the top surface of an SiN film 52-2 is exposed by RIE using O₂ gas, the residual SiN and SiO₂ portions are sequentially etched by isotropic etching. As a result, an undercut 54 is formed in an SiO₂ film 50', as shown in FIG. 3D. Therefore, a gate electrode metal can be lifted off irrespective of deposition techniques.

As another modification, there is a method of controlling a gate threshold voltage of the resultant transistor such that a metal such as Pt, Ti or Pd capable of forming compound upon reaction with GaAs is used as the gate electrode, and that a chemical reaction between the metal and GaAs is activated by annealing. In the above embodiment, the gate electrode comprises platinum, but the gate electrode does not react with GaAs after the gate electrode is formed since annealing is not performed. Furthermore, since ion implantation is performed at a dose of $3.0 \times 10^{12}$ ions/cm² and an acceleration voltage of 100 keV, the resultant FET is of a normally on type. However, when annealing is performed at a temperature of 380° C. for 30 minutes so as to react Pt with GaAs, a Schottky barrier is formed within the active layer. As a result, the thickness of the active layer under the gate can be substantially decreased, and a normally off FET can be obtained.

Figure 4A:
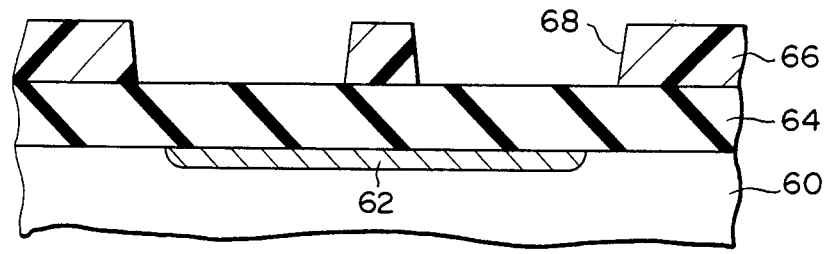
FIGS. 4A-4I illustrates, in schematic cross-section, some of the major steps in formation of a GaAs MESFET by using a manufacturing method according to a second embodiment of the present invention.

The manufacturing method of a GaAs MESFET according to a second embodiment will be described with reference to FIGS. 4A to 4I. Referring to FIG. 4A, silicon ions Si⁺ are selectively ion-implanted in a Cr-doped semi-insulating GaAs substrate 60 at an acceleration voltage of 100 keV and a dose of $3.0 \times 10^{12}$ ions/cm² so as to form an active layer 62. The active layer 62 is formed by annealing such that the ion-implanted substrate 60 is held in an arsine atmosphere at a temperature of 850° C. for 15 minutes. An SiO₂ film 64 of 1 μm thickness is deposited by low temperature (e.g., 400° C. or less) CVD on the annealed substrate 60 with the active layer 62. A photoresist layer 66 having an opening pattern 68 which defines the source and drain regions is formed on the SiO₂ film 64, as shown in FIG. 4A.

Subsequently, the structure of FIG. 4A is subjected to RIE in a gas mixture of CF₄ and H₂, so that openings 70 are formed in the SiO₂ film 64. The surface areas of the GaAs substrate 60 exposed through the openings 70 are given as source and drain formation regions, respectively. Si⁺ ions are implanted in the resultant structure at a dose of $3 \times 10^{12}$ ions/cm² and an acceleration voltage of 150 keV, thereby forming high-impurity source and drain regions 71a and 71b, as shown in FIG. 4B.

It should be noted that RIE was used as anisotropic etching to etch the SiO₂ film 64 using the photoresist layer 66 as the mask pattern. The reason why anisotropic etching is adopted lies in the fact that the degradation of patterning precision is then prevented. More specifically, in a portion as the prospective gate electrode, the width of the SiO₂ film 64 is at most 1 to 2 μm. On the other hand, the thickness of the SiO₂ film 64 is as large as 1 μm. When normal isotropic etching is performed, patterning precision is greatly degraded due to side etching. In RIE, the etching ratios of SiO₂ to GaAs and SiO₂ to the photoresist film can be 1:10 or more and 1:5 or more, respectively, resulting in convenience. By anisotropic etching in RIE, SiO₂ film components which have vertical wall surfaces with respect to the substrate surface can be obtained, as indicated by reference numerals 64-1 and 64-2 in FIG. 4C. During the RIE process, even if excessive etching is performed, the GaAs substrate 60 will not be substantially etched. In addition, although the semiconductor is slightly damaged by ion bombardment, this damage can be neglected in comprison with the damage caused by high-impurity ion implantation. The damage by RIE can be completely recovered by annealing for activating the impurity at a temperature of 800° C. or higher.

Figure 4B:
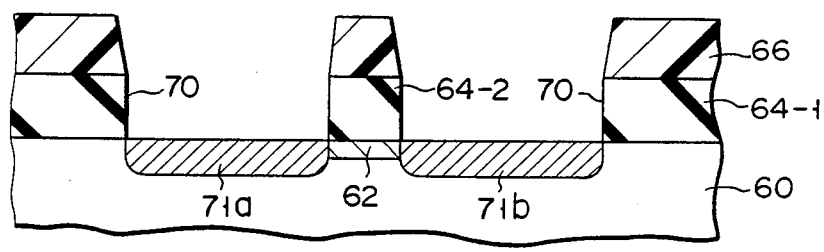
Figure 4C:
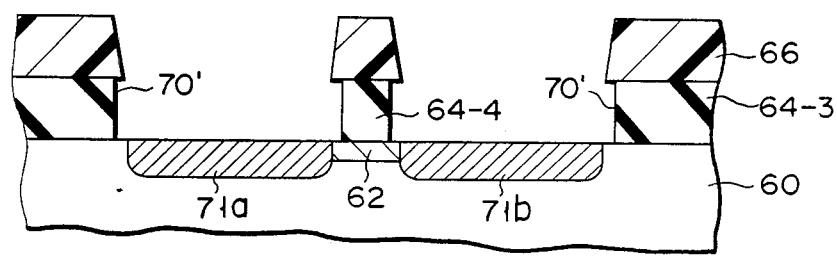

When ion implantation, as shown in FIG. 4B, is completed and source and drain regions 71a and 71b are formed, etched SiO₂ film components 64-3 and 64-4 are subjected to side etching. The side wall surfaces of the SiO₂ film components are isotropically etched to a predetermined depth (e.g., a depth of 0.2 μm from the surface), thereby obtaining the narrowed film components 64-3 and 64-4, as shown in FIG. 4C. After ion implantation at a high impurity concentration is performed, the SiO₂ film components are side-etched by isotropic etching. The purpose of side etching is (1) to shorten the gate length in the same manner as the first embodiment described above and (2) to prevent overlapping between the gate and each of the high impurity layers.

If the width of the SiO₂ film component 64-4 on the active layer 62 is 1 μm, the pattern width of the gate electrode becomes 0.6 μm ($=1.0-(0.2 \times 2)$) upon side etching the SiO₂ film component 64-4 by 0.2 μm. Therefore, a submicron gate can be formed by the conventional exposure method. In addition, when ion implantation and annealing are performed, the impurity can be laterally diffused. For this reason, when the gate electrode pattern is obtained from the SiO₂ film 64 without performing side etching, the gate electrode may partially overlap the high impurity layers. This leads to an increase in gate-source capacitance Cgs. In addition to this disadvantage, the breakdown voltage in the gate-drain path is decreased. In the worst case, the high impurity layers are short-circuited. Side-etching of the SiO₂ film components 64-1 and 64-2 prevents a short circuit between the high impurity layers. The distances between the gate and one high impurity region and between the gate and the other high impurity region can become minimum although the gate can be sufficiently isolated from the high impurity regions.

The method of this embodiment can also prevent the offset caused by directivity of ion implantation. In general, ion implantation is performed while the substrate is inclined by about 5° to 10° so as to prevent the formation of a surface channel or surface depletion region. Therefore, in the method wherein the side wall surfaces of the mask are etched before ion implantation is performed, one of the high impurity regions (source and drain) comes abnormally close to the gate.

However, according to the method of the present invention, side-etching is performed after ion implantation, and so the above drawback can be properly prevented. The side wall surfaces of the SiO₂ film 64 can be etched by normal wet etching. However, chemical dry etching (CDE) is adopted in this embodiment because the side wall surfaces can be uniformly etched with good controllability.

Figure 4D:
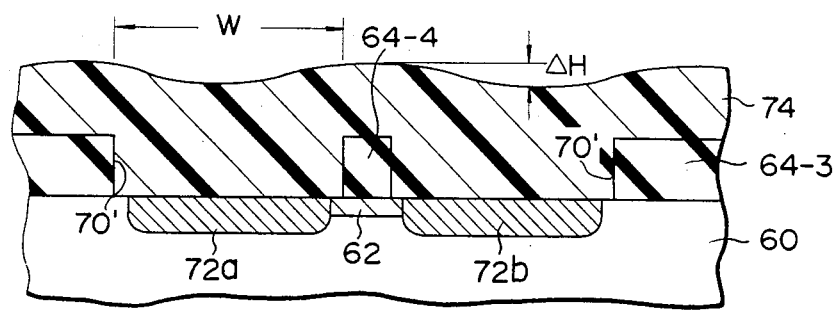

The photoresist pattern 66 is removed from the structure (FIG. 4C) having the side-etched SiO₂ film components 64-3 and 64-4. The resultant structure is then annealed in an arsine atmosphere at 800° C. for about 10 minutes while the residual SiO₂ film components 64-3 and 64-4 serving as the mask pattern for impurity ion implantation are left on the substrate, thereby obtaining high impurity regions 72a and 72b which are electrically activated. As illustrated in FIG. 4D, a photoresist layer 74 is formed on the GaAs substrate 60 having the SiO$_2$ film components 64-3 and 64-4. During the formation of the photoresist material, coverage, i.e., flatness of the layer 74 must be improved to determine controllability of resist etching for exposing the top surface of the SiO$_2$ film component 64-4.

In the structure shown in FIG. 4D, the present inventors found that a difference ΔH between a surface level (about 1 μm) of a portion of the photoresist layer which was formed on the high impurity regions 72a and 72b of the substrate 60 and a surface level of the portion of the photoresist layer which was formed on the SiO$_2$ films 64-3 and 64-4 was so small that the photoresist layer 74 was practically flat. This fact is based on the assumption that a photoresist material can be sufficiently filled in openings 70' defined by the side-etched SiO$_2$ film components 64-3 and 64-4 even if a normal photoresist coating technique is used since a width W of each of the openings 70' is at most about 5 to 10 μm. Actually, the present inventors found that the difference ΔH of the surface levels of portions of the photoresist film 74 which did and did not overlay the SiO$_2$ films was less than 0.1 μm when the width W of the opening was 7 μm and a positive photoresist material having a viscosity of 27 cp was applied at a speed of 6,000 rpm for 30 seconds.

Figure 4E:
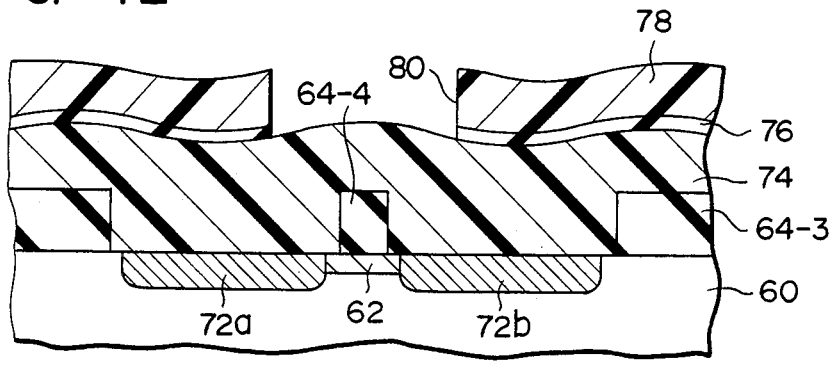

An SiN film 76 is deposited by sputtering on the photoresist layer 74 to a thickness of 1,000 Å. A second photoresist layer 78 is then deposited on the SiN film 76. The photoresist layer 78 is patterned to have an opening pattern 80 with a larger width than that of the SiO$_2$ film component 64-4. The SiN film 76 is etched by RIE using the photoresist layer 78 as a mask, thereby forming openings, as illustrated in FIG. 4E. This process is performed such that the underlying photoresist layer 74 is recessed in a specific area consisting of a substrate portion corresponding to the prospective gate electrode and its peripheral portion, thereby exposing the top surface of the SiO$_2$ film 64-4.

Figure 4F:
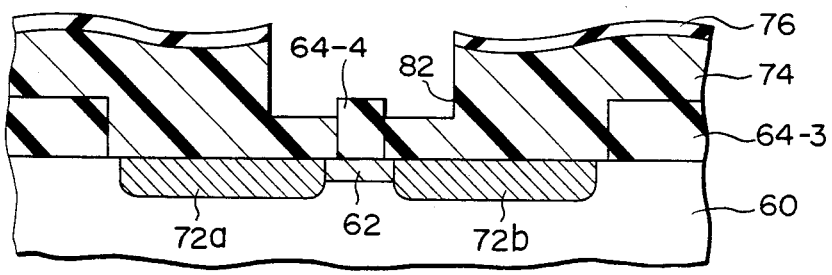
Figure 4G:
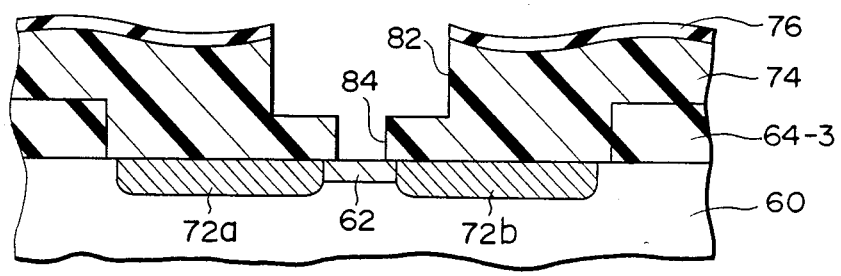

Subsequently, a corresponding portion of the underlying photoresist layer 74 is removed by RIE using O$_2$ gas by using as a mask the selectively etched SiN film 76, thereby obtaining a recessed portion 82, as shown in FIG. 4F. The formation of the recessed portion 82 exposes the top surface of the SiO$_2$ film component 64-4. In this case, the photoresist film 74 was etched at a rate of 800 Å/min when the flow rate of O$_2$ gas was 10 cc/min, the gas pressure was 0.05 Torr, and the RF power was 100 W. This etching is anisotropically performed, thus providing good controllability. The etching rate of the SiN film 76 was less than 80 Å/min. In this case, the thickness of the photoresist film 74 was 1.0 μm on the SiO$_2$ film 64-4 and 2.0 μm on the GaAs substrate 60. It was easy to stop performing RIE on the photoresist film 74 when the top surface of the SiO$_2$ film 64-4 was exposed. In addition, the margin of the thickness of the photoresist film was as large as 1 μm. The RIE method using O$_2$ gas improves controllability, surface flatness and reproducibility, as compared with those of wet etching. When the photoresist film 74 was sufficiently etched by RIE for 15 minutes, the top surface of the SiO$_2$ film 64-4 was exposed, shown in FIG. 4F.

When the SiO$_2$ film component 64-4 having the exposed top surface is removed from the structure shown in FIG. 4F, an opening 84 is formed in the bottom surface of the recess of the photoresist layer 74. The opening 84 has substantially the same size as that of the etched film component 64-4. The substrate surface is partially exposed through the opening 84. Aluminum is deposited to cover the entire surface of the structure of FIG. 4G to a thickness of about 1,000 Å while the photoresist layer 74 having the pattern described above is left on the substrate. The layer 74 is then subjected to a lift-off operation, so that a metal layer 86 serving as the gate electrode of the GaAs MESFET is formed on the substrate 10. The pattern of the gate electrode 86 is the same as that of the side-etched, narrowed SiO$_2$ film component 64-4 prior to the formation of the photoresist layer 74. The two ends of the gate electrode 86 are respectively spaced by 0.2 μm apart from the opposing ends of the source and drain regions 72a and 72b. As a result, the gate capacitance Cgs of the MESFET can be decreased to contribute to the improvement of high-frequency characteristics.

Figure 4H:
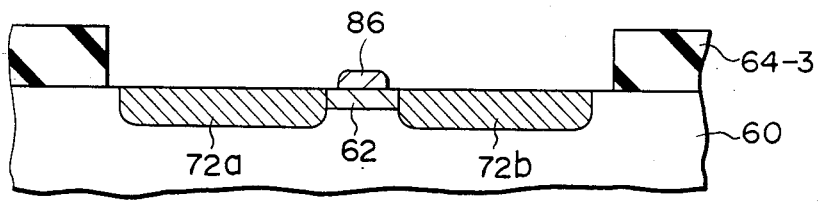
Figure 4I:
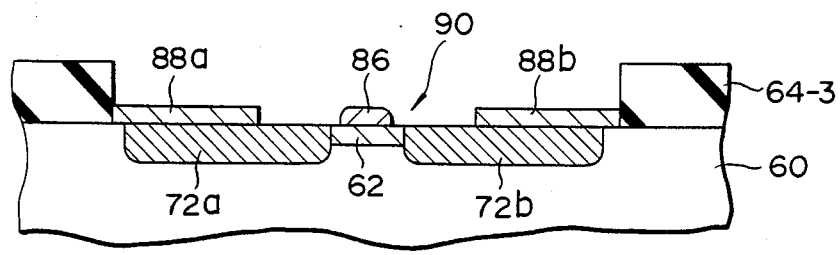

Thereafter, source and drain electrodes 88a and 88b are formed from an Au-Ge based alloy, as shown in FIG. 4I. The source and drain electrodes 88a and 88b may be formed before the photoresist film 74 is flattened. As a result, the actual gate length is as short as 0.6 μm although the gate length of the mask is 1 μm. In addition, the distances between the gate and the source and between the gate and the drain are respectively 0.2 μm. Therefore, a high-speed, high-performance GaAs MESFET 90 can be obtained wherein the source series capacitance and the gate capacitance are very small and the drain breakdown voltage is 10 V or more. In addition, the FETs formed on the wafer and different wafers have uniform electrical characteristics. Furthermore, the gate electrode is formed after the source and drain regions are formed, so that high temperature annealing need not be performed after the gate electrode is formed. As a result, a self-aligned FET can be obtained without using a metal of high heat resistance.

The present inventors also prepared as a comparative example another type of MESFET in which the SiO$_2$ film 64-2 was not side-etched. The comparative example is compared with the second embodiment described above. The defective elements which were caused by the short circuit between the gate electrode and the high impurity layers were found in the comparative example. However, the elements according to the present invention were free from this type of defect. In addition, the drain breakdown voltage of the FET of the comparative example was small and varied from 4 V to 8 V. However, the FET of the present invention had a high drain breakdown voltage of 10 V to 12 V. The reason why the drain breakdown voltage is low in the comparative example lies in the fact that the gate comes excessively close to the high impurity layers. In addition, variations in the drain breakdown voltage are caused by the inclination of the substrate by 7° at the time of ion implantation. However, the FET of the second embodiment is free from any of the above defects.

Aluminum is the most common metal used to form the gate electrode of the GaAs MESFET in the process of FIG. 4H. However, the gate electrode metal may comprise Pt, Pd, Ti or the like which reacts with GaAs to form an alloy. In this case, the chemical reaction between the metal and GaAs is performed by annealing so as to form a Schottky barrier in the GaAs substrate, thereby controlling a threshold voltage of the MESFET. According to the experiment of the present inventors, an example of a normally off type FET obtained by reacting GaAs with Pt as the gate electrode metal material had a lower source-gate series resistance Rs and a higher transconductance gm than those of the FET of the second embodiment. This fact is based on the assumption that the gate is spaced by 0.2 μm apart from the source and drain, and the source-gate resistance becomes low since the treshold voltage of the resultant FET is controlled by annealing after the Pt gate electrode is formed.

Although the present invention has been shown and described with respect to particular embodiments, various changes and modifications which are obvious to a person skilled in the art to which the invention pertains are deemed to lie within the spirit and scope of the invention. For example, the insulating film may comprise SiN in place of $SiO_2$. Various types of deposition techniques, etching techniques and etching gases may be arbitrarily used. The active layer may be formed by epitaxial growth instead of ion implantation. The present invention can also be applied to any other compound semiconductor such as InP. Any film other than the photoresist film can be utilized to obtain a flat surface.

Figure 5A:
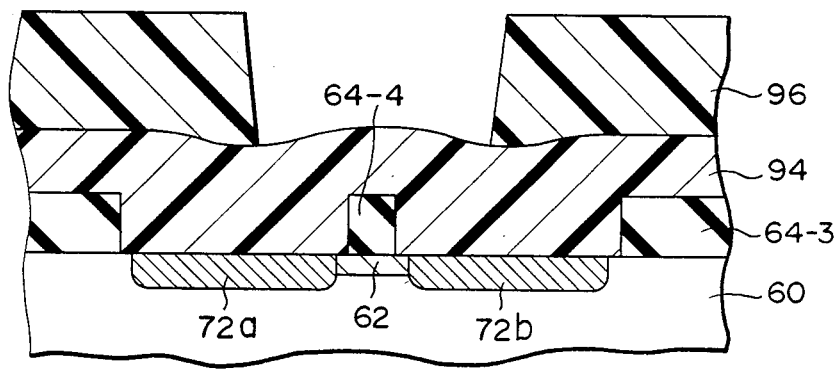
FIGS. 5A-5B illustrates, in schematic cross-section, some of the major steps in formation of a GaAs MES- FET, which is presented as a modification of the embodiment shown in FIGS. 4A–4I.
Figure 5B:
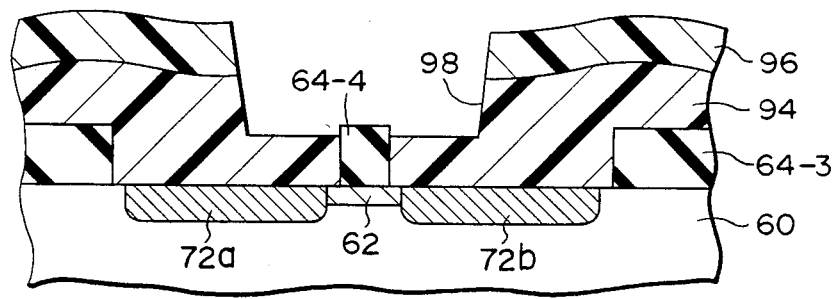

The process of the second embodiment, as shown in FIGS. 4D to 4F, can be simplified as follows. The photoresist layer 78 is formed on the SiN film 76 which overlays the photoresist layer 74, as illustrated in FIG. 4E. However, as shown in FIG. 5A, a two-layer structure consisting of a positive photoresist layer 94 and a negative photoresist layer 96 may be adopted. The layers 94 and 96 comprise heterogeneous resist materials and an isolation film between the layers 94 and 96 need not be formed. The layer 96 can be patterned by using the difference between developing characteristics of the layers 94 and 96. In this state, RIE is performed using $O_2$ gas, thereby forming a recessed portion 98 as illustrated in FIG. 5B. As a result, the top surface of the $SiO_2$ film component 64-4 is exposed. In this manner, the exposure of the top surface of the $SiO_2$ film to the atmosphere can be simplified. The subsequent process is the same as the prescribed process.

What is claimed is:

1. A method of manufacturing a Schottky gate type field effect transistor having gate, source and drain electrodes, said method comprising the steps of:
   (a) etching an insulating layer on a compound semiconductor substrate to obtain an insulating layer component having a first width so as to define a prospective gate electrode formation region;
   (b) implanting ions into said substrate to form in said compound semiconductor substrate first and second semiconductor regions corresponding to the source and drain electrodes of the transistor, said first and second semiconductor regions being self-aligned with said insulating layer component;
   (c) side-etching said insulating layer component so that said insulating layer component has a second width smaller than the first width;
   (d) annealing said compound semiconductor substrate; and
   (e) replacing said insulating layer component having the second width with a metal layer corresponding to the gate electrode, whereby a width of the gate electrode thus obtained is smaller than a distance between the source and drain electrodes so as to decrease capacitances between the gate electrode and the source electrode and between the gate electrode and the drain electrode; said steps (a)–(e) being performed in the order listed.

2. The method according to claim 1, wherein the step of replacing said insulating layer component with the gate electrode comprises substeps of:
   forming an organic layer on a structure wherein said insulating layer component having the second width is formed on said compound semiconductor substrate in such a manner that a top surface of said insulating layer component is exposed;
   removing said insulating layer component, whereby said organic layer has an opening which has substantially the same size as the second width of said insulating layer component, said compound semiconductor substrate being partially exposed through said opening; and
   forming the metal layer on an exposed surface portion of said compound semiconductor substrate through said opening.

3. The method according to claim 2, wherein said organic layer having said opening is removed from said compound semiconductor substrate according to a lift-off process, after said metal layer is formed on said exposed surface portion of said compound semiconductor substrate.

4. The method according to claim 3, wherein said insulating layer component having the first width is etched by chemical dry etching at both side wall surfaces thereof by a given distance only substantially along a lateral direction.

5. The method according to claim 3, wherein said organic layer comprises a photoresist material.

6. The method according to claim 4, further comprising the step of forming a mask layer defining the prospective gate electrode formation region of said compound semiconductor substrate, said mask layer being formed on said insulating layer formed on said compound semiconductor substrate, whereby a portion of said insulating layer which is present under said mask layer is left as said insulating layer component obtained by etching said insulating layer.

7. The method according to claim 6, wherein said mask layer is left on said insulating layer component through ion-implanting for forming the source and drain electrodes and side-etching of said insulating layer component.

8. The method according to claim 7, wherein said mask layer is removed from said insulating layer component before said substrate is annealed.

9. The method according to claim 8, wherein said mask layer comprises a metal material.

10. The method according to claim 8, wherein said mask layer comprises a photoresist material.

11. The method according to claim 8, further comprising the step of forming in said compound semiconductor substrate an electrically active layer on which said insulating layer component with said mask layer is positioned, before said insulating layer is formed on said compound semiconductor substrate.

12. The method according to claim 8, wherein the step of forming on said compound semiconductor substrate said organic layer such that said top surface of said insulating layer component is exposed, comprises the substeps of:
   applying an organic material on an entire surface of said compound semiconductor substrate having the source and drain electrodes and said insulating layer component of the second width, said organic material including a photoresist material; and etching a surface portion of a photoresist layer of the organic material by anisotropic etching, thereby decreasing a thickness of said photoresist layer so as to expose said top surface of said insulating layer component.

13. The method according to claim 8, wherein the step of forming on said compound semiconductor substrate said photoresist layer such that said top surface of said insulating layer component is exposed, comprises the substeps of:

applying an organic material on an entire surface of said compound semiconductor substrate having the source and drain electrodes and said insulating layer component of the second width, said organic material including a photoresist material; and partially recessing a portion of a photoresist layer of the organic material and performing anisotropic etching to expose the top surface of said insulating layer component through a bottom surface of a recessed portion.

14. The method according to claim 5, wherein said compound semiconductor substrate comprises gallium arsenide.

* * * * *